(12) United States Patent
Bhawmik

(10) Patent No.: US 8,806,400 B1
(45) Date of Patent: Aug. 12, 2014

(54) SYSTEM AND METHOD OF TESTING THROUGH-SILICON VIAS OF A SEMICONDUCTOR DIE

(71) Applicant: QUALCOMM Incorporated, San Diego, CA (US)

(72) Inventor: Sudipta Bhawmik, Bridgewater, NJ (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 13/745,899

(22) Filed: Jan. 21, 2013

(51) Int. Cl.
G06F 17/50 (2006.01)

(52) U.S. Cl.
USPC .................. 716/106; 716/111; 716/136

(58) Field of Classification Search
USPC ............................. 716/106, 111, 136
See application file for complete search history.

(56) References Cited

U.S. PATENT DOCUMENTS

| 7,046,026 | B2 | 5/2006 | Chao et al. | |
|---|---|---|---|---|
| 8,188,469 | B2 | 5/2012 | Lee et al. | |
| 8,362,481 | B2 * | 1/2013 | Sellathamby et al. | 257/48 |
| 8,362,482 | B2 * | 1/2013 | Or-Bach et al. | 257/48 |
| 2002/0074637 | A1 * | 6/2002 | McFarland | 257/686 |
| 2009/0321893 | A1 * | 12/2009 | Somasekhar et al. | 257/621 |
| 2010/0047963 | A1 * | 2/2010 | Wang et al. | 438/107 |
| 2011/0089552 | A1 * | 4/2011 | Park et al. | 257/686 |
| 2011/0102006 | A1 | 5/2011 | Choi et al. | |
| 2012/0097944 | A1 | 4/2012 | Lin et al. | |
| 2012/0105093 | A1 | 5/2012 | Lee | |
| 2013/0093455 | A1 * | 4/2013 | Whetsel | 324/762.03 |

OTHER PUBLICATIONS

Noia, Brandon et al., "Pre-Bond Probing of TSVs in 3D Stacked ICs," International Test Conference, 2011 IEEE (Institute of Electrical and Electronics Engineers) International, <http://people.ee.duke.edu/~krish/teaching/ECE269/noiaITC.pdf>, 2011, pp. 1-10.

* cited by examiner

Primary Examiner — Sun Lin
(74) Attorney, Agent, or Firm — Toler Law Group, PC

(57) ABSTRACT

A method includes contacting a first group of through-silicon vias (TSVs) contacts with a multi-contact probe and applying a first voltage value to each of the first group of TSV contacts via the multi-contact probe, where the first group of TSV contacts corresponds to a first group of TSVs. The method also includes determining, based on a second voltage value detected at a particular TSV of the first group of TSVs, whether the particular TSV corresponds to a TSV test result.

31 Claims, 8 Drawing Sheets

US 8,806,400 B1

SYSTEM AND METHOD OF TESTING THROUGH-SILICON VIAS OF A SEMICONDUCTOR DIE

I. FIELD

The present disclosure is generally related to semiconductor die testing and more specifically to testing through-silicon vias.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities that may be enabled by circuitry on one or more semiconductor dies. Electrical connections to a semiconductor die (e.g., a semiconductor die for a portable personal computing device) may be formed using thru-silicon vias (TSVs), such as to transfer power or signals from one die to another in a stack of dies.

Testing thru-silicon vias and electrical contacts for TSVs (e.g., micro-bumps) of a thinned semiconductor die (e.g., a semiconductor die after a thinning process, such as a grinding process, a polishing process, etc.) may be challenging. For example, TSVs commonly have small dimensions, such as a diameter less than or equal to ten micrometers and pitch (i.e., TSV pattern spacing) less than or equal to twenty micrometers. Such small dimensions impede or prevent traditional probing that involves contacting a single tester probe to a single electrical contact on a die due to the high resolution required for probe positioning and contact. Further, a thinned die, such as a thinned die that is manufactured to create a three-dimensional (3D) stacked integrated circuit (IC), may not be able to sustain the force that typical tester probes can exert during probe touchdowns (i.e., physical contacting of probes with electrical contacts on a semiconductor die).

III. SUMMARY

Systems and methods of testing enable a device to detect of an open condition and/or a short condition of TSVs on a semiconductor die to determine a quality of the semiconductor die (e.g., to classify a die as a known good die (KGD)). TSVs (and bumps) of a KGD may be determined to be capable of transmitting information across multiple dies in a stack of dies.

For example, a multi-contact probe may be positioned to be in contact with one or more TSV contacts (e.g., four adjacent TSV contacts in a 2×2 arrangement) concurrently. The multi-contact probe may be configured to provide a first voltage value, such as a logical high value or a logical low value, to a first group of the one or more TSV contacts. A determination may be made, based on a second voltage value detected at a particular TSV of the first group, whether the particular TSV corresponds to a TSV test result. The TSV test result may be a TSV open condition, a TSV short condition, or a combination thereof.

In a particular embodiment, a method includes contacting a first group of TSV contacts with a multi-contact probe and applying a first voltage value to each of the first group of TSV contacts via the multi-contact probe, where the first group of TSV contacts corresponds to a first group of TSVs. The method also includes determining, based on a second voltage value detected at a particular TSV of the first group of TSVs, whether the particular TSV corresponds to a TSV test result.

In another particular embodiment, an apparatus includes a semiconductor device. The semiconductor device includes one or more TSV contacts coupled to one or more TSVs. Each TSV is coupled to a respective bi-directional buffer circuit that includes an output enable cell, an output buffer cell, and an input buffer cell. The apparatus also includes a TSV test circuit configured, after a first group of the one or more TSV contacts is contacted with a multi-contact probe and a first voltage value is applied to each of the first group of TSV contacts via the multi-contact probe, where the first group of TSV contacts corresponds to a first group of the one or more TSVs, to determine, based on a second voltage value detected at a particular TSV of the first group of TSVs via the respective bi-directional buffer circuits, whether the particular TSV corresponds to a TSV test result.

One particular advantage provided by at least one of the disclosed embodiments is an ability for a device to determine a test result of TSVs of a semiconductor die (e.g., to detect an open condition and/or a short condition), enabling enhanced determination of the quality of the semiconductor die. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

TSVs may be designed to extend from an active area of a semiconductor die to an electrical contact on the bottom of the semiconductor die. For example, a TSV may be formed by etching a region extending from the active area into the substrate of the semiconductor die, depositing a conductive material such as copper into the region, etching or polishing a bottom surface of the semiconductor die to reach the conductive material, and depositing the electrical contact to contact the conductive material. However, an electrical open condition may occur in a TSV where the TSV (i.e., the conductive material in the region) does not form a conductive path between the electrical contact and the active area. For example, an open condition may result from a void being formed within the TSV during a metal fill stage of TSV formation.

TSVs may be designed to be electrically isolated from each other. However, a short condition between TSVs may occur where a conductive path exists between two TSVs. For example, a short condition can be caused by misaligned micro-bumps or defective metallization during TSV formation.

An undetected open condition and/or a short condition of TSVs of a semiconductor die may interfere with transmitting information from the semiconductor die to other dies, thus rendering the semiconductor die defective.

Figure 1:
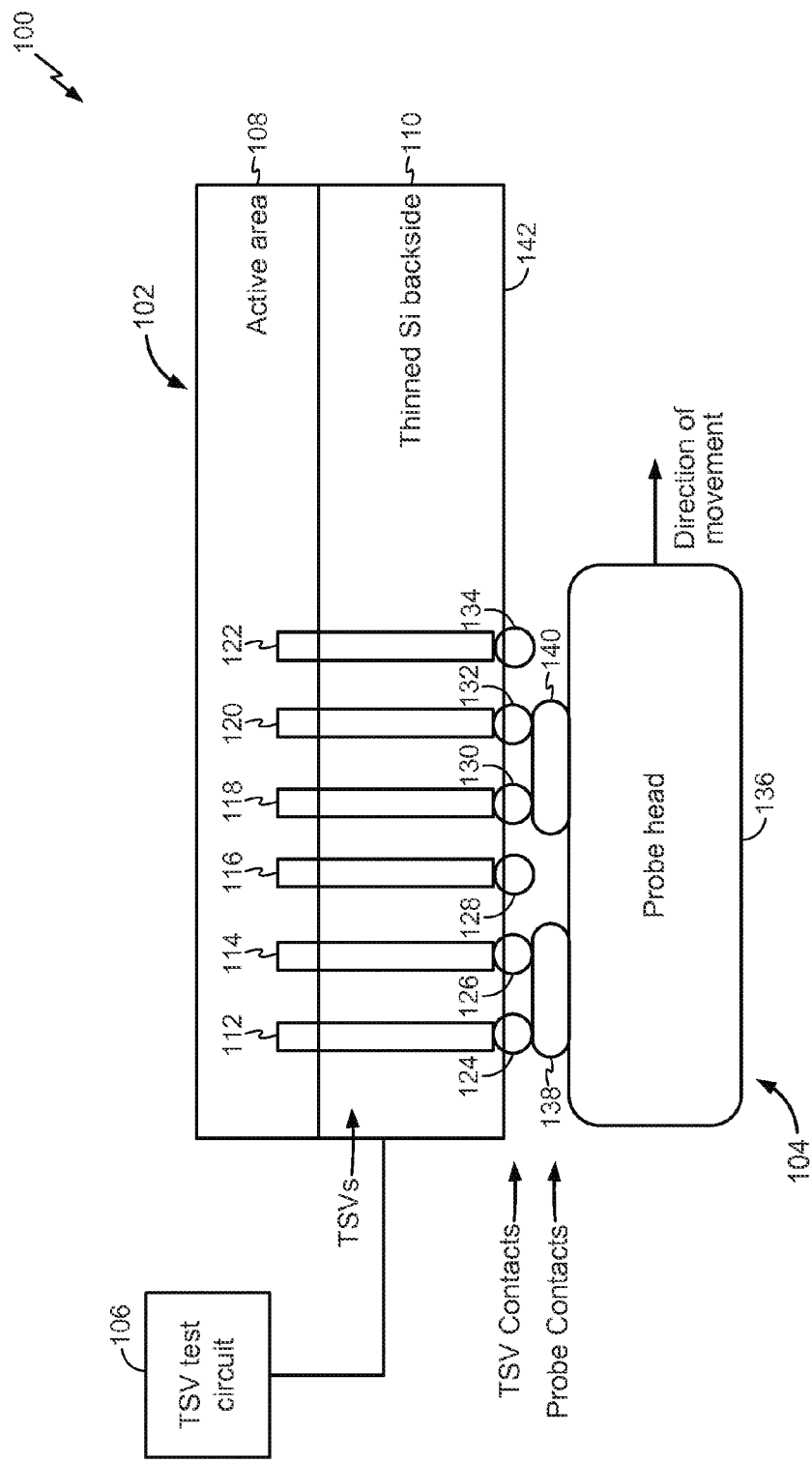
FIG. 1 is a diagram to illustrate a particular embodiment of a system that is operable to test TSVs of a semiconductor die.

FIG. 1 is a diagram to illustrate a particular embodiment of a system 100 that is operable to test TSVs of a semiconductor die. The system 100 may include a semiconductor die 102 (shown in a cross sectional view), a multi-contact probe 104 (e.g., a membrane probe), and a TSV test circuit 106. The semiconductor die 102 may be a thinned silicon die (e.g., a semiconductor die after a thinning process, such as a grinding process, a polishing process, etc.). The semiconductor die 102 may include an active area 108 (e.g., a top side of a semiconductor die), a thinned silicon (Si) backside 110, and TSVs 112, 114, 116, 118, 120, and 122 that extend from the active area 108 to the thinned Si backside 110. Each TSV 112, 114, 116, 118, 120, and 122 may be electrically coupled to a respective TSV contact 124, 126, 128, 130, 132, and 134 at a bottom surface 142 of the semiconductor die 102.

Each TSV contact 124, 126, 128, 130, 132, and 134 may be a micro-bump and may have a diameter less than or equal to approximately ten micrometer (μm) and a pitch less than or equal to approximately twenty μm. The TSVs 112, 114, 116, 118, 120, and 122 (and the TSV contacts 124, 126, 128, 130, 132, and 134) may be arranged according to a grid orientation (e.g., rows and columns). The pitch and/or size may be too small for conventional testing with a single probe.

The multi-contact probe 104 may include a probe head 136 and probe contacts 138 and 140 coupled to the probe head 136. The multi-contact probe 104 (shown in a cross sectional view) may be dimensioned and positioned to be in electrical contact with a particular number of TSVs (via the TSV contacts) concurrently using the probe contacts 138 and 140 and the probe head 136. For example, each of the probe contacts 138 may be in electrical contact with four TSVs via physical contact with a 2×2 array of TSV contacts, as illustrated with respect to FIG. 2. The multi-contact probe 104 may exert substantially equal force on each TSV contact of the particular number of TSV contacts that are in contact with the multi-contact probe 104.

A TSV in electrical contact with the multi-contact probe 104 may be referred to as a "contact TSV (CTSV)." A TSV not in electrical contact with the multi-contact probe 104 may be referred to as a "non-contact TSV (NCTSV)." The multi-contact probe 104 may be configured to provide a conductive path between each of the CTSVs during open-circuit/open condition testing of the TSVs as described with reference to FIG. 3. The multi-contact probe 104 may also be configured to provide a common voltage (e.g., a logical high value or a logical low value) to a first group of the CTSVs during short-circuit/short condition testing of the TSVs as described with reference to FIG. 2.

The TSV test circuit 106 may be coupled to the semiconductor die 102 or integrated as part of the semiconductor die 102. The TSV test circuit 106 may be configured to provide a voltage (e.g., a voltage corresponding to a logical value, a programmable voltage) to each TSV 112, 114, 116, 118, 120, and 122 and to detect a voltage value (e.g., a logical value) of each TSV using respective bi-directional buffer circuits and a scan chain. Examples of the bi-directional buffer circuits and the scan chain are described in further detail with reference to FIG. 4 and FIG. 5, respectively. A processor integrated into the semiconductor die 102 may be programmed to determine whether any CTSVs have a short condition or an open condition.

During operation, the multi-contact probe 104 and the TSV test circuit 106 may perform a short condition and/or an open condition test on the semiconductor die 102 to detect the presence of short and/or open conditions in the TSVs 112, 114, 116, 118, 120, and 122 (and corresponding TSV contacts 124, 126, 128, 130, 132, and 134). Short condition testing may include determining whether applying a voltage at one TSV affects a voltage at another TSV. For a short condition test, the multi-contact probe 104 may apply a first voltage (e.g., a logical low value, a logic zero) to the CTSVs (e.g., the TSVs 118 and 120) prior to detecting a second voltage at each CTSV. In a particular embodiment, the first voltage is a weak zero that is weakly applied at the CTSV and may be overcome by applying another voltage (corresponding to a logic one) at the CTSV via a short-circuit path to another TSV. The TSV test circuit 106 may apply a third voltage (e.g., a logical high value or a logic one) to NCTSVs (e.g., the TSVs 116 and 122) that are adjacent to the CTSVs prior to detecting the second voltage at each CTSV. The TSV test circuit 106 may detect the second voltage at each CTSV and may compare the second voltage to the third voltage to determine whether a short condition exists in any CTSVs. The TSV test circuit 106 may determine that the short condition exists in a particular CTSV when the second voltage sensed from the particular CTSV and the third voltage have the same value (e.g., same logical value).

Open condition testing may include determining whether, when two TSV contacts are electrically connected, a change in voltage of one TSV causes a change in voltage of the other TSV. For an open condition test, the multi-contact probe 104 may apply the first voltage to the CTSVs (e.g., TSVs 118 and 120). The TSV test circuit 106 may apply the third voltage to a first CTSV (e.g., TSV 118) of a group of CTSVs (e.g., TSVs 118 and 120) prior to detecting the second voltage at a second CTSV (e.g., TSV 120) of the group of CTSVs. The TSV test circuit 106 may detect the second voltage at the second CTSV of the group of CTSVs and compare the second voltage to the third voltage to determine whether an open condition exists in the second CTSV (and a corresponding TSV contact). The TSV test circuit 106 may determine that the open condition exists in the second CTSV when the second voltage and the third voltage have different values.

After performing the short condition and/or the open condition test using a first placement of the multi-contact probe 104, the multi-contact probe 104 or the semiconductor die 102 may move to other TSVs that have not been tested to perform the short condition and/or open condition test until all the TSVs are tested. The multi-contact probe 104 may move relative to the semiconductor die 102 by a distance corresponding to one or more rows of the TSVs in an X-direction, one or more columns of the TSVs in a Y-direction, or a combination thereof. The multi-contact probe 104 and the TSV test circuit 106 may also perform other types of tests on the semiconductor die 102, such as a TSV impedance test (time required to charge a TSV) or a TSV placement test (whether each TSV is placed in the correct position on a semiconductor die).

In a particular embodiment, the multi-contact probe 104 is a cantilever probe. In another particular embodiment, the multi-contact probe 104 is a membrane probe. The TSV test circuit 106 may be integrated in the semiconductor die 102, such as a state machine processor or other circuitry, or may be external to the semiconductor die 102 (e.g., integrated in a testing device of a test bed). Although FIG. 1 illustrates a semiconductor die including TSVs, it should be understood that the present disclosure is not limited to silicon technologies or TSVs and may apply to testing of any type of via that is coupled to a contact on a surface of a semiconductor device. Similarly, although FIG. 1 illustrates six TSVs, six TSV contacts, and one multi-contact probe, in other embodiments, any number of TSVs, TSV contacts, and/or multi-contact probes may be present.

The system 100 may thus enable a device (e.g., the multi-contact probe 104 and/or the TSV test circuit 106) to detect an open condition and/or a short condition of TSVs of a semiconductor die (e.g., the semiconductor die 102), which may provide determination of the quality of the semiconductor die. The determination of the quality of semiconductor dies using TSV testing may reduce a component failure rate of devices that include the semiconductor dies.

Figure 2:
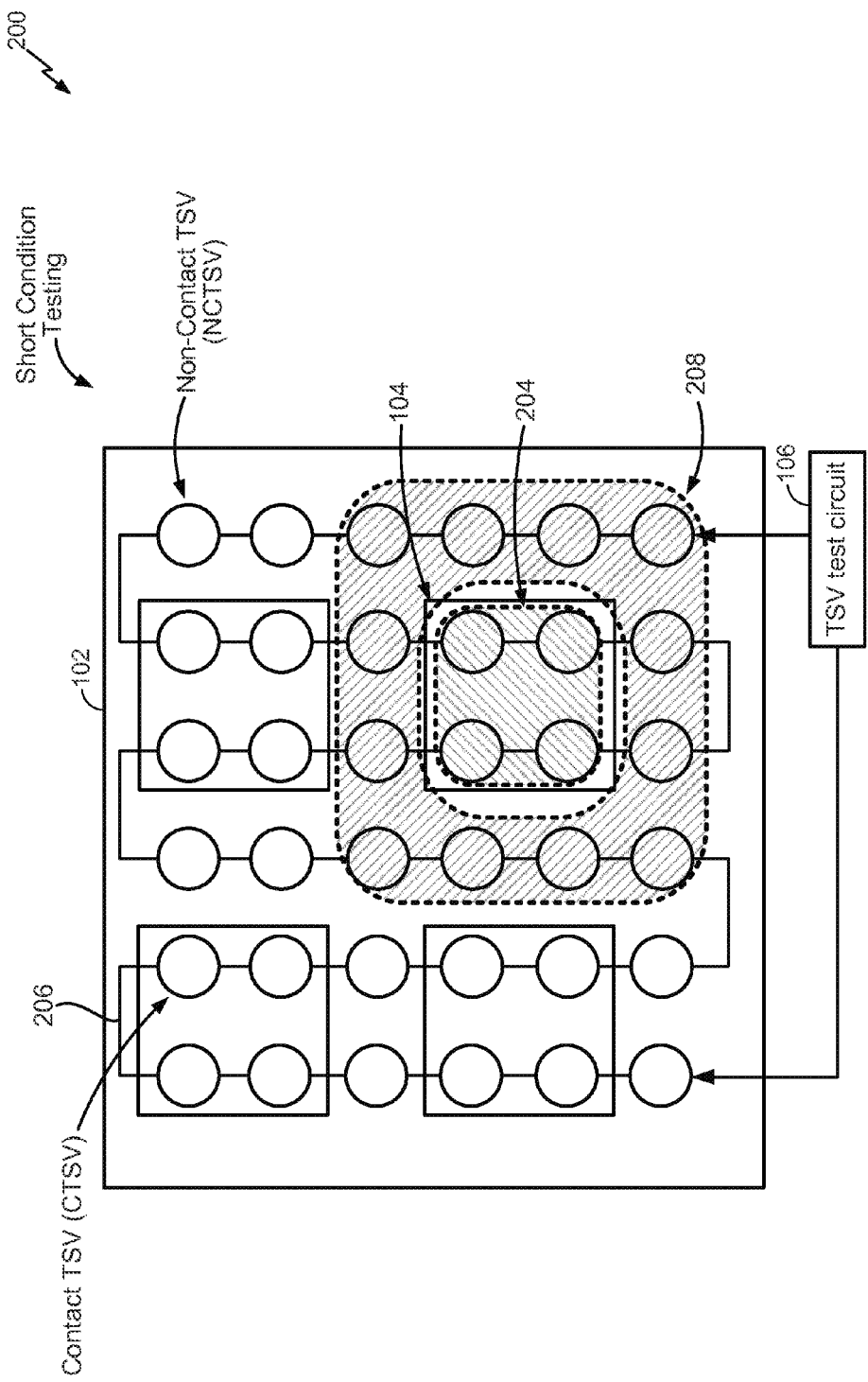
FIG. 2 is a diagram to illustrate a particular embodiment of aspects of the system of FIG. 1 that is operable to test a short condition of the TSVs.

FIG. 2 is a diagram to illustrate a particular embodiment of aspects of the system 100 of FIG. 1 that is operable to test the short condition of the TSVs and is generally designated 200. As illustrated in FIG. 2, the semiconductor die 102 may include a plurality of TSVs (e.g., the TSVs 112, 114, 116, 118, and 120 of FIG. 1). The plurality of TSVs may include a first group of CTSVs 204 and a second group of NCTSVs 208. The semiconductor die 102 may also include a scan chain 206 that may be connected to each TSV of the plurality of TSVs. To perform the short condition test, the multi-contact probe 104 may be in electrical contact with one or more groups of the plurality of the TSVs during each iteration of a testing process according to the TSV test circuit 106 until the plurality of TSVs are tested. The TSV test circuit 106 may be electrically coupled with the plurality of TSVs to apply a voltage via the scan chain 206 to each TSV and to read a voltage at each TSV for the short condition test.

The first group of CTSVs 204 may be a group of TSVs that are subjected to the short condition test. The second group of NCTSVs 208 may be a group of TSVs that are adjacent to the first group of CTSVs 204. A voltage detected at the second group of NCTSVs 208 may serve as a reference point to help determine whether a short condition exists in any TSV of the first group of CTSVs 204.

During operation, the multi-contact probe 104 may apply the first voltage value to the first group of at least four CTSVs 204 (e.g., a 2×2 array) concurrently. The TSV test circuit 106 may apply a first set of voltage values via the scan chain 206 to the first group of CTSVs 204 and to the second group of NCTSVs 208. The application of the first set of voltage values may cause each CTSV of the first group of CTSVs 204 to have a high-impedance output value (i.e., a voltage of the TSVs is allowed to "float," (i.e., to be influenced by external voltages)) and may cause each NCTSV of the second group of NCTSVs 206 to have a logical high voltage value (e.g., the third voltage value). The high-impedance output value in the first group of CTSVs 204 may enable the first voltage value applied by the multi-contact probe 104 to be overridden by a voltage of an adjacent NCTSV when a short condition exists between a CTSV and the adjacent NCTSV. The TSV test circuit 106 may detect the second voltage value at each CTSV of the first group of CTSVs 204 and compare the second voltage value to the third voltage value to determine whether the short condition is detected in any CTSV of the first group of CTSVs 204. The short condition may be determined in response to the second voltage value (detected at a CTSV of the first group of CTSVs 204) and the third voltage value (applied to the NCTSVs of the second group of NCTSVs 208) having the same value or substantially the same value (e.g., the same logical value). After each CTSV of the first group of CTSVs 204 has been tested for short condition, the multi-contact probe 104 may move to test other TSVs until all the TSVs are tested for short condition. Alternatively, the semiconductor die 102 may be moved (e.g., by a support arm) so that each TSV makes contact with the multi-contact probe 104 for short condition testing.

Figure 3:
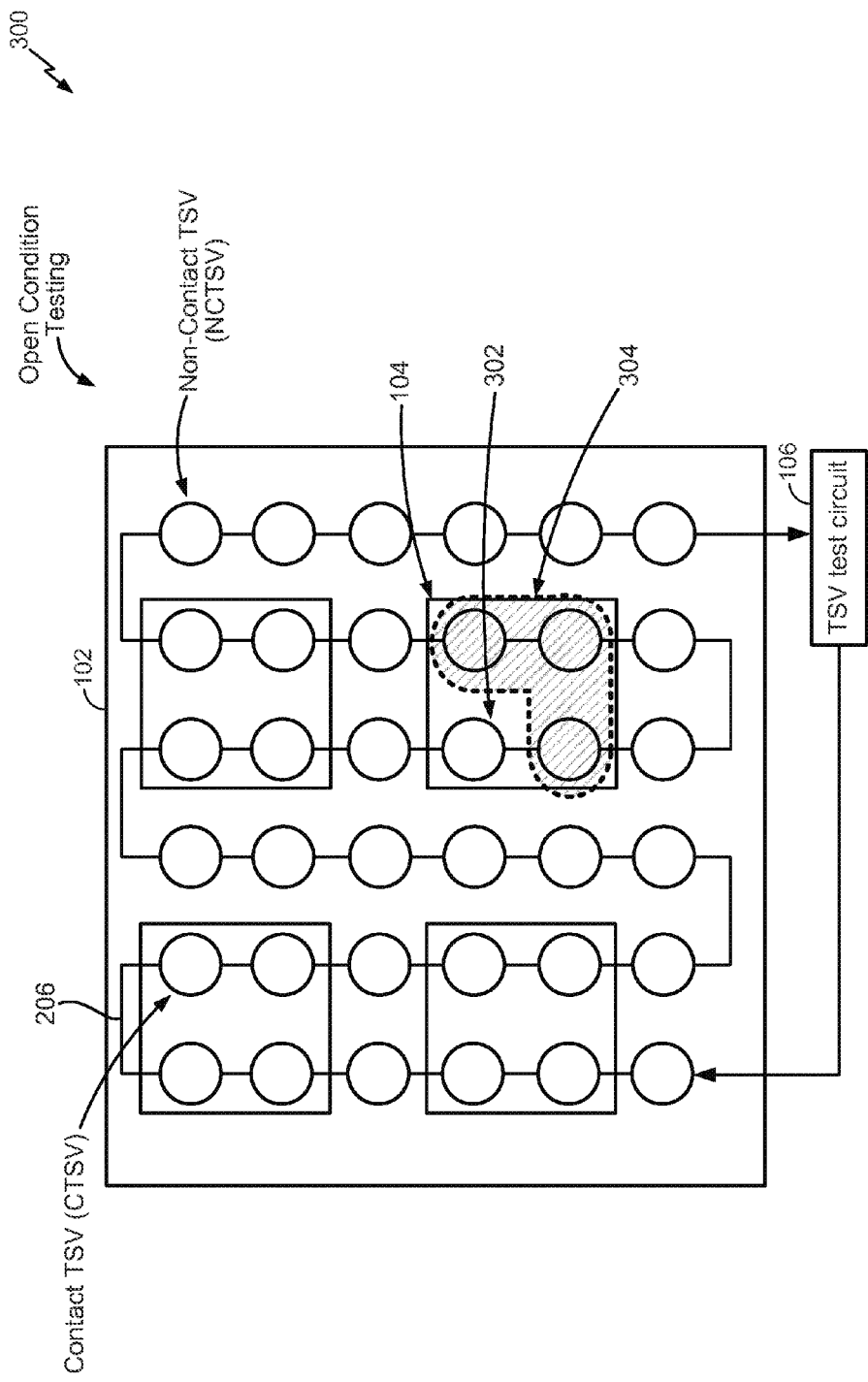
FIG. 3 is a diagram to illustrate another particular embodiment of aspects of the system of FIG. 1 that is operable to test an open condition of the TSVs.

FIG. 3 is a diagram to illustrate a particular embodiment of aspects of the system 100 of FIG. 1 that is operable to test the open condition of the TSVs and is generally designated 300. As illustrated in FIG. 3, the semiconductor die 102 may include the plurality of TSVs (e.g., the TSVs 112, 114, 116, 118, and 120 of FIG. 1). The plurality of TSVs may include the first group of CTSVs 204. Similar to FIG. 2, the semiconductor die 102 may also include the scan chain 206 that may be connected to each TSV of the plurality of TSVs. To perform the open condition test, the multi-contact probe 104 may be in electrical contact with groups of the plurality of the TSVs during each iteration of a testing process in accordance with the open condition test until the plurality of the TSVs are tested. The TSV test circuit 106 may be electrically coupled with the plurality of TSVs to apply a voltage via the scan chain 206 to each TSV and/or to read a voltage at each TSV for the open condition test.

The first group of CTSVs 204 may include a particular CTSV 302 and other TSVs 304. The particular CTSV 302 may be a TSV subjected to the open condition test. The other TSVs 304 may be TSVs adjacent to the particular CTSV 302 within the first group of CTSVs 204. The other TSVs 304 may serve as a reference point to help determine whether an open condition exists in the particular CTSV 302.

During operation, the multi-contact probe 104 may apply the first voltage value to the first group of CTSVs 204. The TSV test circuit 106 may apply a second set of voltage values via the scan chain 206 to the first group of CTSVs 204. The application of the second set of voltage values may cause a particular CTSV 302 of the first group of CTSVs 204 to have the logical high output value (e.g., the third voltage value) and to cause each CTSV of other CTSVs 304 of the first group of CTSVs 204 to have the high-impedance output value. The TSV test circuit 106 may detect the second voltage value at one of the other CTSVs 304 and determine whether the open condition exists in the particular CTSV 302. The open condition may be determined in response to the second voltage value (detected at one of the other CTSVs 304) and the third voltage value (applied to the particular CTSV 302) having different values. When the second voltage value and the third voltage value have the same value, an electrical path is detected from the particular CTSV 302 (via the particular CTSV 302's contact, across the multi-contact probe 104) to the other TSVs 304 (and to the other TSVs 304's contacts) or vice versa. The electrical path may enable current to travel from the particular CTSV 302 to the other TSVs 304 so that the other TSVs 304 may have the same voltage value or substantially the same voltage value (the third voltage value) as the voltage value (the second voltage value) at the particular CTSV 302.

After each CTSV of the first group of CTSVs 204 has been tested for open condition, the multi-contact probe 104 may move to test other TSVs until all the TSVs are tested for open condition. Alternatively, the semiconductor die 102 may be moved (e.g., by a support arm) so that each TSV makes contact with the multi-contact probe 104 for open condition testing.

Figure 4:
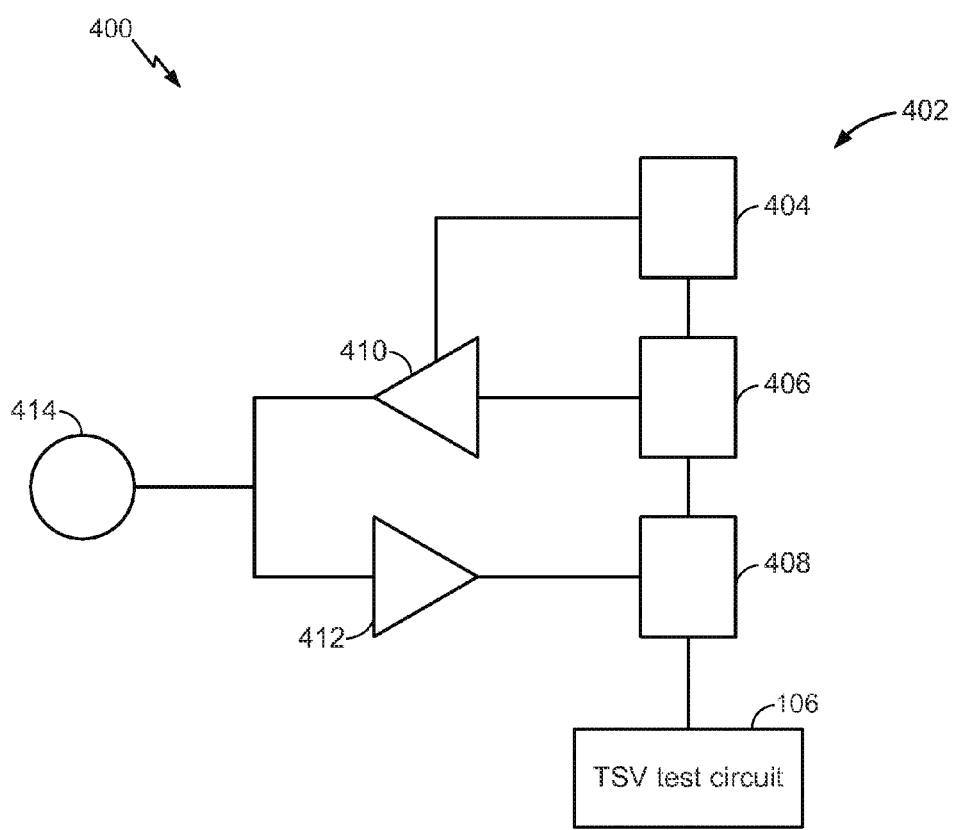
FIG. 4 is a block diagram to illustrate a particular embodiment of a bi-directional buffer circuit that may be included in the system of FIG. 1.

FIG. 4 is a block diagram to illustrate a particular embodiment 400 of a bi-directional buffer circuit 402 configured for use during open and short testing of a TSV 414. The bi-directional buffer circuit 402 may include an output enable cell (OEC) 404, an output buffer cell (OBC) 406, an input buffer cell (IBC) 408, an output buffer 410, and an input buffer 412. The input buffer 412 may be coupled to provide a signal to the IBC 408 based on a voltage value at the TSV 414. The output buffer 410 may be coupled to provide a voltage value to the TSV 414 based on a value at the OBC 406. The output buffer 410 may also be responsive to a value at the OEC 404 (e.g., an enable signal) to selectively enter a high impedance state where the output buffer 410 does not drive a voltage at the TSV 414 to enable the voltage at the TSV 414 to float prior to reading a voltage at the TSV 414 via the input buffer 412.

The bi-directional buffer circuit 402 may be configured to couple with other bi-directional buffer circuits to form one or more scan chains (e.g., the scan chain 206 of FIG. 2). The one or more scan chains may enable providing the logical high, the logical low, or the high-impedance output value to each TSV of a semiconductor die (e.g., TSVs 112-122 of the semiconductor die 102 of FIG. 1) and to enable reading a voltage value from each selected TSV of the semiconductor die.

During the short condition test, when the TSV 414 is a TSV in the first group of CTSVs 204 of FIG. 2, the TSV test circuit 106 may populate the OEC 404, the OBC 406, and/or the IBC 408 of the bi-directional buffer circuit 402 with the first set of voltage values via the one or more scan chains to cause the output buffer 410 to have the high-impedance output value and to read, via the one or more scan chains, a voltage value of the IBC 408 to determine whether the TSV 414 has the short condition. When the TSV 414 is a TSV in the second group of NCTSVs 208 of FIG. 2, the TSV test circuit 106 may populate the OEC 404, the OBC 406, and/or the IBC 408 of the bi-directional buffer circuit 402 to cause the output buffer 410 to have the logical high output value.

During the open condition test, when the TSV 414 is the particular CTSV 302 of FIG. 3, the TSV test circuit 106 may populate the OEC 404, the OBC 406, and/or the IBC 408 of the bi-directional buffer circuit 402 with the second set of voltage values via the one or more scan chains to enable the TSV 414 to have the logical high output value. When the TSV 414 is one of the other TSVs 304 of FIG. 3, the TSV test circuit 106 may populate the OEC 404, the OBC 406, and/or the IBC 408 of the bi-directional buffer circuit 402 with the second set of voltage values via the one or more scan chains to cause the output buffer 410 to have the high impedance output value, and the TSV test circuit 106 may read, via the one or more scan chains, the voltage value of the IBC 408 to determine whether the TSV 414 has the open condition. The one or more scan chains may be controlled via a chain test access module, as described in further detail with reference to FIG. 5.

Figure 5:
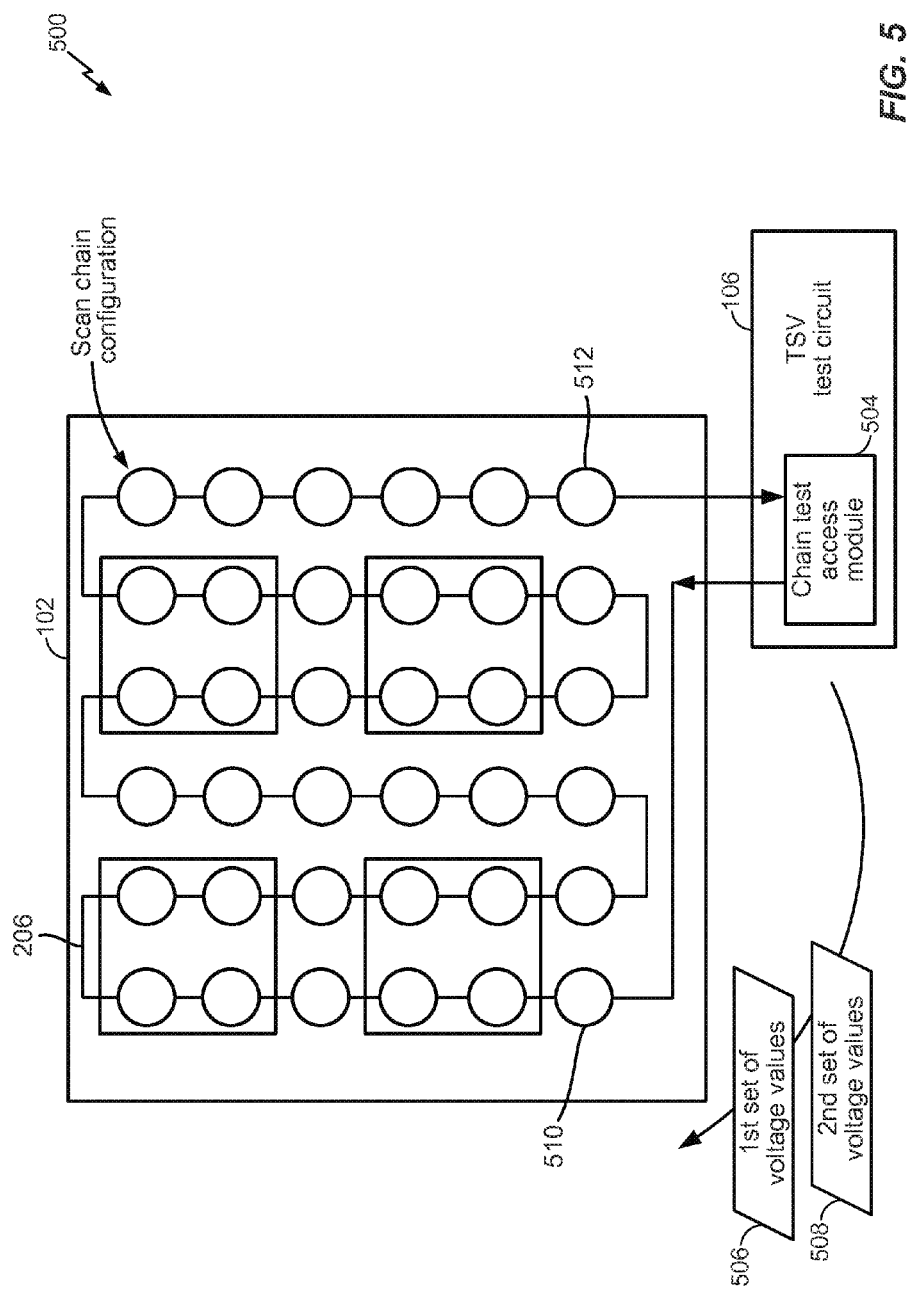
FIG. 5 is a diagram to illustrate a particular embodiment of a scan chain configuration associated with the system of FIG. 1.

FIG. 5 is a diagram to illustrate a particular embodiment 500 of a scan chain configuration associated with the system 100 of FIG. 1. The scan chain configuration (e.g., how the scan chain 206 may be configured) may be arranged to enable the TSV test circuit 106 to test each TSV of the semiconductor die 102 for the short condition and/or the open condition. In a particular embodiment, the scan chain configuration is arranged to enable a first set of voltage values 506 and a second set of voltage values 508 to traverse through each TSV of the semiconductor die 102 via the scan chain 206, starting with a TSV 510 and ending with a TSV 512 (in the direction of the arrow). The TSVs 510 and 512 may be TSVs of the semiconductor die 102 of FIG. 1 (e.g., the TSVs 112 and 114).

A chain test access module 504 may be configured to control scan operations for TSV testing. The chain test access module 504 may be configured to provide the first set of voltage values 506 and the second set of voltage values 508 and to receive test voltage values returned via the scan chain 206. The chain test access module 504 may be integrated with the TSV test circuit 106 or may be electrically coupled to the TSV test circuit 106. In a particular embodiment, the chain test access module 504 is a joint test access group (JTAG)-type controller.

During operation of the short condition testing, the chain test access module 504 and/or the TSV test circuit 106 may populate bi-directional buffer circuits (e.g., the bi-directional buffer circuit 402 of FIG. 4) with the first set of voltage values 506 (e.g., corresponding to a first set of logical values) via one or more scan chains (e.g., the scan chain 206) to cause a first group of TSVs (e.g., the first group of CTSVs 204 of FIG. 2) to have a floating voltage and to cause a second group of TSVs (e.g., the second group of NCTSVs 208) adjacent to the first group of TSVs to have the logical high voltage value. The chain test access module 504 and/or the TSV test circuit 106 may also read, via the one or more scan chains, a voltage value (e.g., corresponding to a logical value) of each input buffer cell (e.g., the IBC 408) corresponding to the first group of TSVs to determine whether any TSV of the first group of TSVs corresponds to the TSV short condition.

During operation of the open condition testing, the chain test access module 504 and/or the TSV test circuit 106 may populate the bi-directional buffer circuits with the second set of voltage values 508 (e.g., corresponding to a second set of logical values) via the one or more scan chains to enable a particular TSV (e.g., the particular CTSV 302 of FIG. 3) of the first group of TSVs to have a logical high voltage value and to enable other TSVs (e.g., the other TSVs 304 of FIG. 3) of the first group of TSVs to have a floating voltage. The chain test access module 504 and/or the TSV test circuit 106 may also read, via the one or more scan chains, a voltage value (corresponding to logical value) of each input buffer cell corresponding to the other TSVs of the first group of TSVs to determine whether any of the other TSVs of the first group of TSVs corresponds to the TSV open condition. After performing the short condition and/or the open condition test on a particular group of TSVs, the semiconductor die 102, the multi-contact probe 104 of FIG. 1, or a combination thereof may move to couple the multi-contact probe 104 to another group of TSVs to perform the short condition and/or open condition test on the other group of TSVs.

A pseudocode example to illustrate a particular embodiment of a method of testing a k×k array of TSVs of a semiconductor die may include:

For each touch-down of a probe head, repeat {
1. Detect short condition:
    Drive probes to "weak zero" from tester (i.e., apply a logical zero value (low) to CTSVs using the multi-contact probe 104, where the logical zero value is weakly applied and may be overcome by the output buffer 410 generating a logical one output)

Drive logic one (High) on all NCTSVs using a TSV scan chain(s) (i.e., load a logical one value into the OEC 404 and the OBC 406 of each NCTSV using the scan chain 206, load a logical zero value into the OEC 404 of each CTSC)

Capture responses on CTSV IBC cells (i.e., scan a value of the IBC 408 of each CTSV to the chain test access module 504 using the scan chain 206)

If any CTSV IBC cell value=logic one then a short failure is detected between a CTSV and a NCTSV Diagnose short condition using the position of the CTSV that captured the logic one value 2. Detect opens:

For each CTSV of the (n×n) CTSVs contacted by a probe (at weak zero):

Drive a logic one (high) to the CTSV from the OBC 406 (e.g., apply a logical one value to the particular CTSV 302)

Capture response on the remaining (n−1) CTSV IBCs (e.g., scan a value of the IBC 408 of each of the other TSVs 304 in the first group of CTSVs 204)

Figure 6:
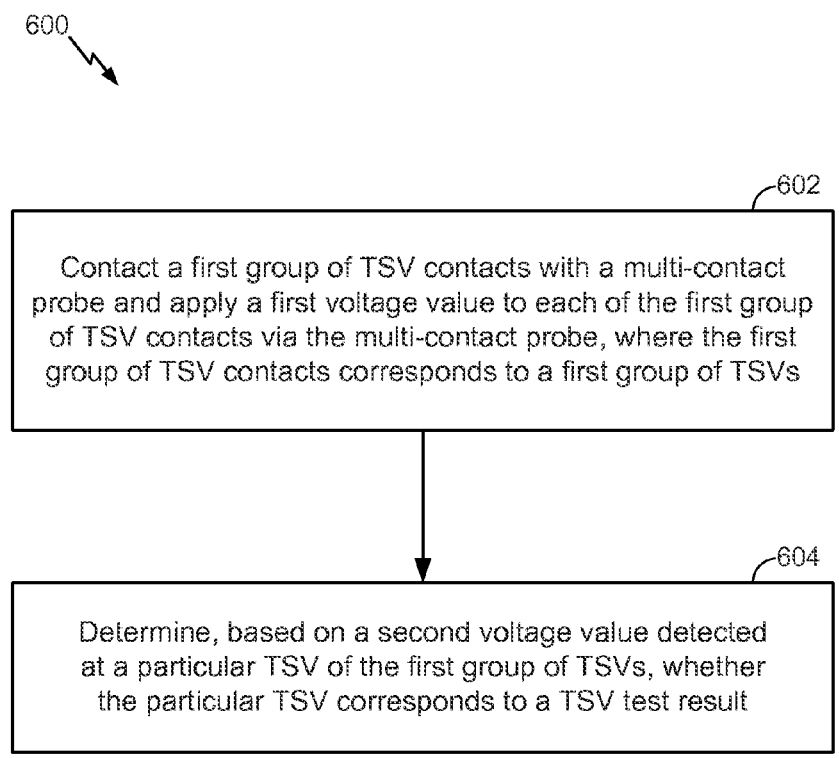
FIG. 6 is a flow chart of a particular embodiment of a method of operation that may be performed at the system of FIG. 1.

If any of the (n−1) IBC values is not a logic one value then the corresponding TSV/micro-bump has a detected open defect 3. Move probe head to next position } until all TSVs in the k×k array of TSVs have been tested FIG. 6 is a flow chart to illustrate a particular embodiment of a method 600 of operation at the system 100 of FIG. 1. The method 600 may include contacting a first group of TSV contacts with a multi-contact probe and applying a first voltage value to each of the first group of TSV contacts via the multi-contact probe, where the first group of TSV contacts corresponds to a first group of TSVs, at 602. For example, in FIG. 1, the multi-contact probe 104 may contact the TSVs 112 and 114 (via the corresponding TSV contacts 124 and 126) and apply the first logical value to the TSVs 112 and 114.

The method 600 may also include determining, based on a second voltage value detected at a particular TSV of the first group of TSVs, whether the particular TSV corresponds to a TSV test result, at 604. For example, in FIG. 1, the TSV test circuit 106 may detect the second logical value at each CTSV and compare the second logical value to a third logical value to determine whether a short condition or an open condition exists in any TSV of the semiconductor die 102.

In a particular embodiment, the method 600 further includes applying the third voltage value to each TSV of a second group of TSVs that are adjacent to the first group of TSVs prior to detecting the second voltage value, where the TSV short condition is determined in response to the second voltage value and the third voltage value having a same logical value. In another particular embodiment, the method 600 further includes applying the third voltage value to a TSV of the first group of TSVs (e.g., the particular CTSV 302 of FIG. 3) prior to detecting the second voltage value at another TSV of the first group of TSVs (e.g., the other TSVs 304 of FIG. 3), where the TSV open condition is determined in response to the second voltage value and the third voltage value having different logical values.

One particular advantage provided by at least one of the disclosed embodiments is an ability to detect an open condition and/or a short condition of TSVs of a semiconductor device (e.g., a thinned semiconductor die) that may cause defective operation of the defective semiconductor device.

Figure 7:
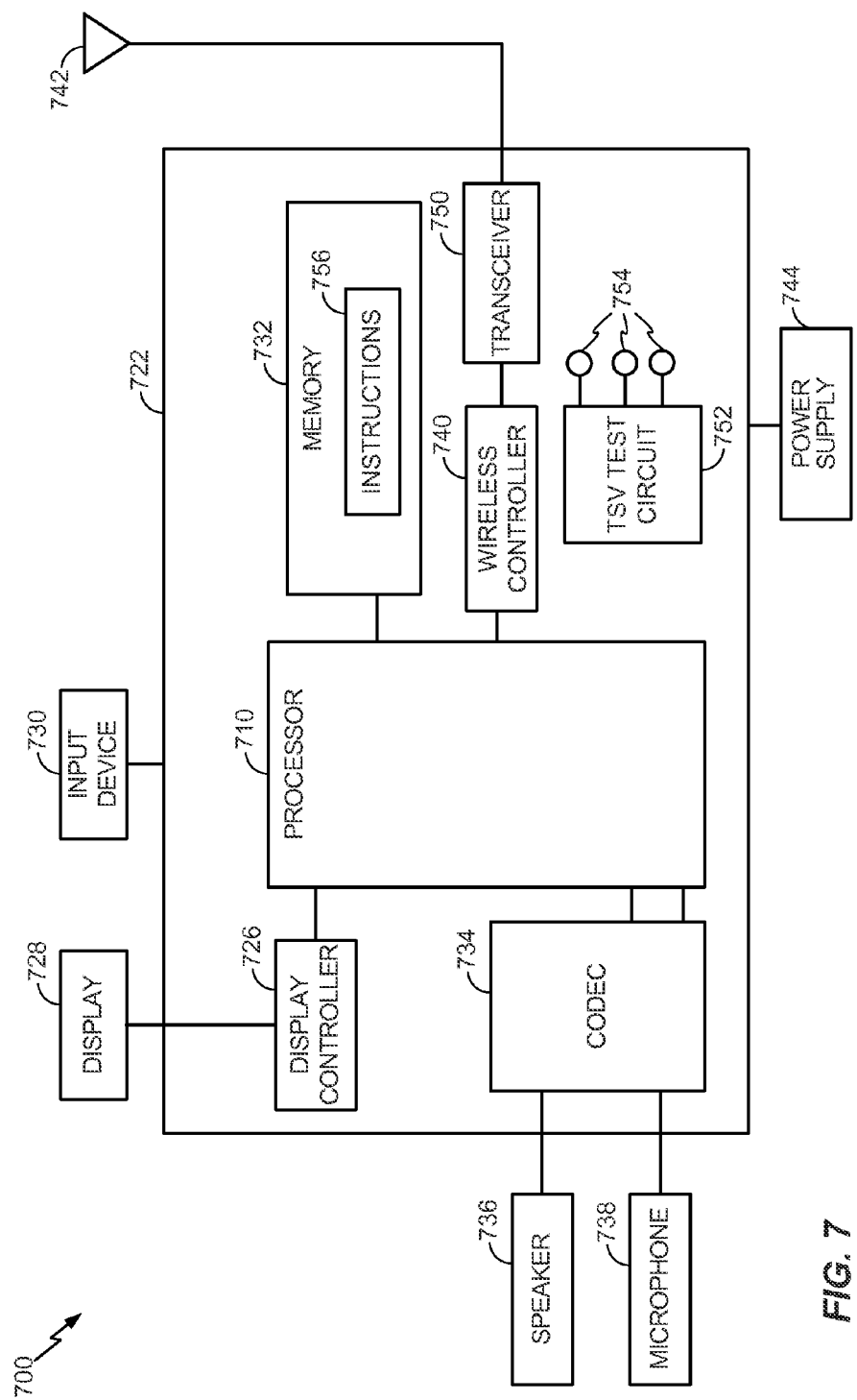
FIG. 7 is a block diagram of a particular embodiment of a communication device including components configured for TSV testing as described in FIG. 1.

FIG. 7 is a block diagram of a particular embodiment of a communication device 700 that includes a semiconductor die (e.g., the semiconductor die 102 of FIG. 1) in a system-on-chip (SoC) device 722 (or in a system-in-package (SiP) device) that includes a TSV test circuit 752 (e.g., the TSV test circuit 106 of FIG. 1) coupled to multiple TSV contacts 754. The communication device 700 may include a processor 710 (e.g., a digital signal processor) coupled to a memory 732.

The memory 732 may be a non-transitory tangible computer-readable and/or processor-readable storage device that stores instructions 756. The instructions 756 may be executable by the processor 710 to implement the functionalities of the TSV test circuit 752, such as populating or selecting test data to apply a first set of voltage values, applying a second set of voltage values, etc., to a TSV scan chain to perform one or more functions or methods described herein, such as the method described with reference to FIG. 6.

FIG. 7 shows that the communication device 700 may also include a display controller 726 that is coupled to the processor 710 and to a display 728. A coder/decoder (CODEC) 734 can also be coupled to the processor 710. A speaker 736 and a microphone 738 can be coupled to the CODEC 734. FIG. 7 also indicates that a wireless controller 740 may be coupled to the processor 710, where the wireless controller 740 is in communication with an antenna 742 via a transceiver 750. The wireless controller 740, the transceiver 750, and the antenna 742 may thus represent a wireless interface that enables wireless communication by the communication device 700. The communication device 700 may include numerous wireless interfaces, where different wireless networks are configured to support different networking technologies or combinations of networking technologies. For example, the communication device 700 may include an IEEE 802.11ah wireless interface.

In an illustrative embodiment, the TSV test circuit 752 is operable to perform the functions described with reference to the TSV test circuit 106 of FIGS. 1-5. The TSV contacts 754 are coupled to TSVs (not shown) that are coupled to the TSV test circuit 752. In an illustrative embodiment, the TSV contacts 754 are the TSV contacts 124, 126, 128 of FIG. 1. The TSV test circuit 752 may be implemented within, or as a part of, the processor 710. In a particular embodiment, the TSV test circuit 752 is implemented as instructions executable by the processor 710 (e.g., the instructions 756). In another particular embodiment, the TSV test circuit 752 is implemented as a component of the system-on-chip device 722 (e.g., as test circuitry).

In a particular embodiment, the processor 710, the display controller 726, the memory 732, the CODEC 734, the wireless controller 740, the transceiver 750, the TSV test circuit 752, and the TSV contacts 754 are included in the system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the antenna 742, and the power supply 744 are external to the system-on-chip device 722. However, each of the display 728, the input device 730, the speaker 736, the microphone 738, the antenna 742, and the power supply 744 can be coupled to a component of the system-on-chip device 722, such as an interface or a controller.

One or more components of the communication device 700 or components analogous thereto, may be integrated into a semiconductor device, such as the semiconductor die 102 of FIG. 1, 2, 3 or 5. For example, the semiconductor die 102 of FIG. 1 may include a wireless controller, a transceiver, a processor, and a memory storing instructions executable by a processor to perform all or part of the method of FIG. 6.

In conjunction with the described embodiments, an apparatus may include means for providing a conductive path between a multi-contact probe and one or more TSVs. For example, the means for providing the conductive path may include the TSV contacts 124, 126, 128, 130, 132, and 134 of FIG. 1, the TSV contacts 754 of FIG. 7, one or more other devices or circuits configured to provide a conductive path, or any combination thereof. The apparatus may also include means for selectively biasing the one or more TSVs to a programmable voltage and for reading a voltage at the one or more TSVs. For example, the means for selectively biasing and for reading the voltage may include the TSV test circuit 106 of FIGS. 1-5, the scan chain 206 of FIG. 2, the bi-directional buffer circuit 402 of FIG. 4, the chain test access module 504 of FIG. 5, the TSV test circuit 752 of FIG. 7, one or more other devices or circuits configured to selectively bias a circuit and to read a voltage at the circuit, or any combination thereof.

The apparatus may further include means for determining, based on a second voltage value detected at a particular TSV of the first group of TSVs, whether the particular TSV corresponds to a TSV open condition or a TSV short condition. The means for determining is configured to detect the presence of the TSV open condition or the TSV short condition after a first group of the one or more TSV contacts is contacted with the multi-contact probe and a first voltage value is applied to each of the first group of TSV contacts via the multi-contact probe. The first group of TSV contacts corresponds to a first group of the one or more TSVs. The means for determining may include the TSV test circuit 106 of FIGS. 1-5, the scan chain 206 of FIG. 2, the bi-directional buffer 402 of FIG. 4, the chain test access module 504 of FIG. 5, the processor 710, the instructions 756, the TSV test circuit 752 of FIG. 7, one or more devices or circuits configured to determine a TSV short and/or open condition, or any combination thereof.

Figure 8:
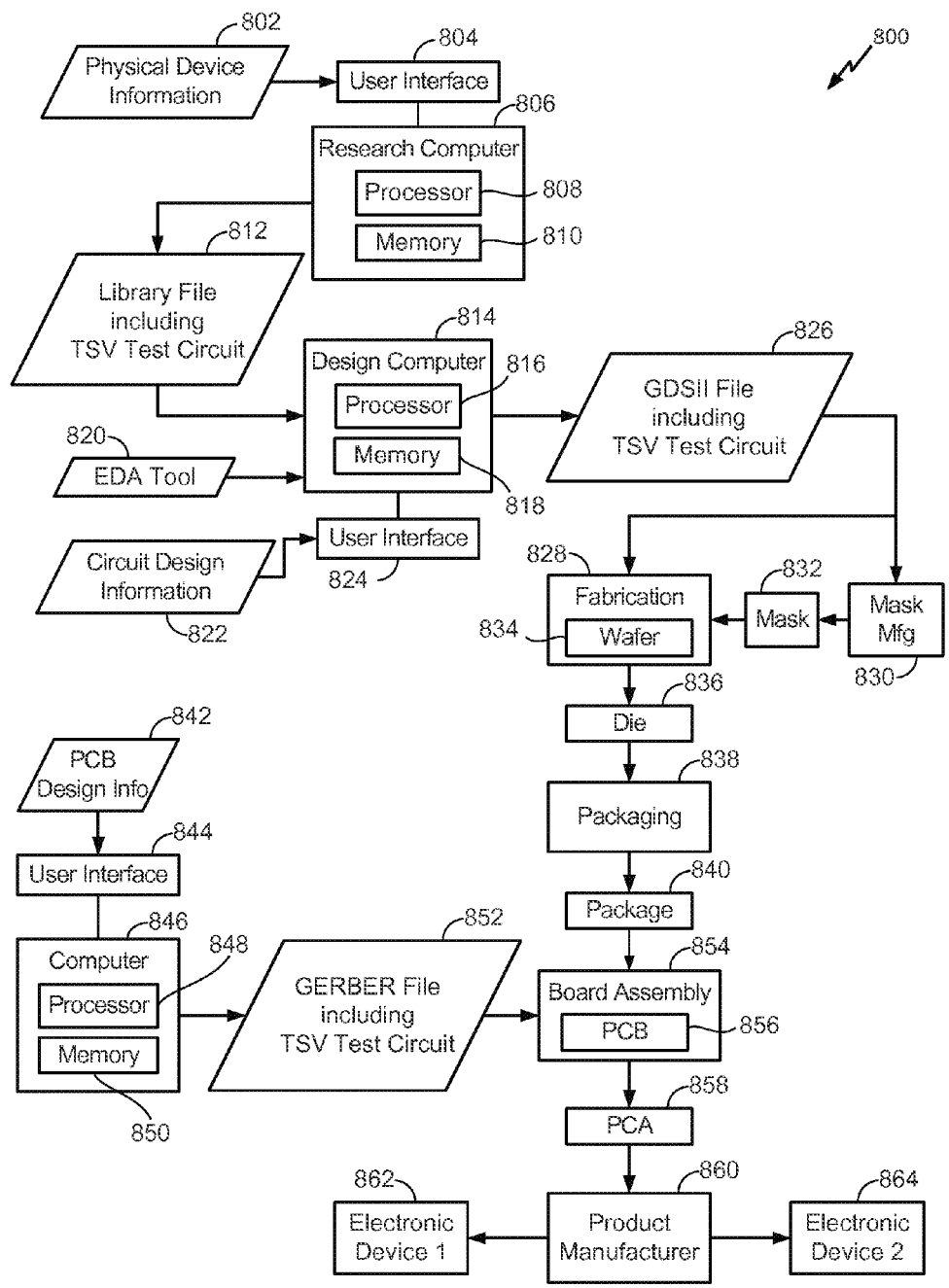
FIG. 8 is a data flow diagram of a particular embodiment of a manufacturing process to manufacture electronic devices that include a TSV testing circuit.

In an illustrative embodiment, the foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as the semiconductor die 102 of FIG. 1, the TSV test circuit 106 of FIG. 1, the bi-directional buffer circuit 402 of FIG. 4, the system-on-chip device 722, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the semiconductor die 102 of FIGS. 1-3 and 5, the TSV test circuit 106 of FIGS. 1-5, the bi-directional buffer circuit 402 of FIG. 2, or the system-on-chip device 722 that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the semiconductor die 102 of FIGS. 1-3 and 5, the bi-directional buffer circuit 402 of FIG. 4, the TSV test circuit 106 of FIGS. 1-5, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as the semiconductor die 102 of FIGS. 1-3 and 5, the TSV test circuit 106 of FIGS. 1-5, the bi-directional buffer circuit 402, the system-on-chip device 722 of FIG. 7, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the semiconductor die 102 of FIGS. 1-3 and 5, the TSV test circuit 106 of FIGS. 1-5, the bi-directional buffer circuit 402, the system-on-chip device 722, or any combination thereof, in addition to other circuits or information. To illustrate, the data file may include information corresponding to a system-on-chip (SOC) that includes the semiconductor die 102 of FIGS. 1-3 and 5, the TSV test circuit 106 of FIGS. 1-5, the bi-directional buffer circuit 402 of FIG. 4, the system-on-chip device 722 of FIG. 7, or any combination thereof and that also includes additional electronic circuits and components within the SOC.

The GDSII file 826 may be received at a fabrication process 828 to manufacture the semiconductor die 102 of FIG. 1, the TSV test circuit 106 of FIG. 1, the semiconductor die 102 of FIG. 2, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the semiconductor die 102 of FIGS. 1-3 and 5, the TSV test circuit 106 of FIGS. 1-5, the bi-directional buffer circuit 402 of FIG. 4, the system-on-chip device 722 of FIG. 7, or any combination thereof.

The die 836 can be tested using the multi-contact probe 104 prior to being incorporated in a package. The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the semiconductor die 102 of FIGS. 1-3 and 5, the TSV test circuit 106 of FIGS. 1-5, the bi-directional buffer circuit 402 of FIG. 4, the system-on-chip device 722 of FIG. 7, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the semiconductor die 102 of FIG. 1, the TSV test circuit 106 of FIG. 1, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the semiconductor die 102 of FIG. 1, the TSV test circuit 106 of FIG. 1, or any combination thereof, is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor die 102 of FIGS. 1-3 and 5, the TSV test circuit 106 of FIGS. 1-5, the bi-directional buffer circuit 402 of FIG. 4, the system-on-chip device 722 of FIG. 7, or any combination thereof may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

One or more of the disclosed embodiments may be implemented in a system or an apparatus that may include a communications device, a fixed location data unit, a mobile location data unit, a mobile phone, a cellular phone, a computer, a tablet, a portable computer, or a desktop computer. Additionally, the system or the apparatus may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-8 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above may be performed by any suitable means capable of performing the operations, such as various hardware and/or software component(s), circuits, and/or module(s). Generally, any operations illustrated in the FIGS. 1-8 may be performed by corresponding functional means capable of performing the operations. Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer-readable storage media and communication media including any medium that facilitates transfer of a computer program from one place to another. A storage media may be any available media that can be accessed by a computer. By way of example, and not limitation, such computer-readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store desired program code in the form of instructions or data structures and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). In addition, in some aspects computer readable medium may include a transitory computer readable medium (e.g., a signal). Combinations of the above should also be included within the scope of computer-readable media.

The methods disclosed herein include one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Thus, certain aspects may include a computer program product for performing the operations presented herein. For example, such a computer program product may include a computer-readable storage medium having instructions stored (and/or encoded) thereon, the instructions being executable by one or more processors to perform the operations described herein. For certain aspects, the computer program product may include packaging material.

Software or instructions (e.g., the instructions 756 of FIG. 7) may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the claims are not limited to the precise configuration and components illustrated above.

The previous description of the disclosed embodiments is provided to enable a person skilled in the art to make or use the disclosed embodiments. While the foregoing is directed to aspects of the present disclosure, other and further aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. A method of testing through-silicon vias (TSVs) of a semiconductor die via TSV contacts external to the semiconductor die, the method comprising:
    contacting a first group of TSV contacts with a multi-contact probe and applying a first voltage value to each of the first group of TSV contacts via the multi-contact probe, wherein the first group of TSV contacts corresponds to a first group of TSVs; and
    determining, based on a second voltage value detected at a particular TSV of the first group of TSVs, whether the particular TSV corresponds to a TSV test result, wherein the particular TSV is coupled to a bi-directional buffer circuit.

2. The method of claim 1, wherein the TSV test result includes a TSV short condition, a TSV open condition, or a combination thereof.

3. The method of claim 1, wherein the multi-contact probe comprises a membrane probe having a probe head dimensioned to contact at least four adjacent TSV contacts concurrently.

4. The method of claim 1, wherein each TSV includes a conductive material in a region extending from an active area of the semiconductor die to a corresponding TSV contact.

5. The method of claim 4, wherein the conductive material includes copper.

6. The method of claim 1, wherein the TSV contacts comprise micro-bumps at a surface of the semiconductor die, each of the micro-bumps electrically coupled to a corresponding TSV.

7. The method of claim 6, wherein each of the micro-bumps has a diameter of less than or equal to approximately ten micrometers, and wherein a micro-bump pitch corresponding to each of the micro-bumps is less than or equal to approximately twenty micrometers.

8. The method of claim 1, further comprising applying a third voltage value to each TSV of a second group of TSVs that are adjacent to the first group of TSVs prior to detecting the second voltage value, wherein a TSV short condition is detected in response to the second voltage value and the third voltage value having a same logical value.

9. The method of claim 8, further comprising applying the third voltage value to a TSV of the first group of TSVs prior to detecting the second voltage value at another TSV of the first group of TSVs, wherein a TSV open condition is detected in response to the second voltage value and the third voltage value having different logical values.

10. The method of claim 1, wherein each particular TSV of the first group of TSVs is coupled to a respective bi-directional buffer circuit that includes an output enable cell, an output buffer cell, and an input buffer cell, and wherein the respective bi-directional buffer circuit is configurable to be coupled to one or more bi-directional buffer circuits to form one or more scan chains to enable providing a logical high, a logical low, or a high-impedance output value to each particular TSV and to enable reading a logical voltage value from each particular TSV.

11. The method of claim 10, further comprising:
    performing a TSV short testing operation that includes:
        populating the bi-directional buffer circuits with a first set of logical values via the one or more scan chains to enable the first group of TSVs to have the high-impedance output value and to enable a second group of TSVs adjacent to the first group of TSVs to have the logical high output value; and
        reading, via the one or more scan chains, a logical value of each input buffer cell corresponding to the first group of TSVs to determine whether any TSV of the first group of TSVs corresponds to a TSV short condition;
    performing a TSV open testing operation that includes:
        populating the bi-directional buffer circuits with a second set of logical values via the one or more scan chains to enable a particular TSV of the first group of TSVs to have the logical high output value and to enable other TSVs of the first group of TSVs to have the high impedance output value; and
        reading, via the one or more scan chains, a logical value of each input buffer cell corresponding to the other TSVs of the first group of TSVs to determine whether any of the other TSVs of the first group of TSVs corresponds to a TSV open condition; and
    moving at least one of the semiconductor die and the multi-contact probe to couple the multi-contact probe to another group of the TSV contacts and applying the TSV short testing operation and the TSV open testing operation to test the other group of TSV contacts.

12. The method of claim 1, wherein a processor within an electronic device determines whether the particular TSV corresponds to a TSV open condition or a TSV short condition.

13. An apparatus comprising:
    a semiconductor device including:
        one or more through-silicon via (TSV) contacts coupled to one or more TSVs, wherein each TSV is coupled to a respective bi-directional buffer circuit; and
        a TSV test circuit configured, after a first group of TSV contacts of the one or more TSV contacts is contacted with a multi-contact probe and a first voltage value is applied to each of the first group of TSV contacts via the multi-contact probe, the first group of TSV contacts corresponding to a first group of TSVs of the one or more TSVs, to determine, based on a second voltage value detected at a particular TSV of the first group of TSVs via the respective bi-directional buffer circuits, whether the particular TSV corresponds to a TSV open condition or a TSV short condition.

14. The apparatus of claim 13, wherein the multi-contact probe comprises a membrane probe having a probe head dimensioned to contact at least four adjacent TSV contacts concurrently.

15. The apparatus of claim 13, wherein each of the one or more TSVs includes a conductive material in a region extending from an active area of the semiconductor device to a corresponding TSV contact.

16. The apparatus of claim 13, wherein each of the one or more TSV contacts comprises a micro-bump at a bottom surface of the semiconductor device, the micro-bump electrically coupled to a corresponding TSV.

17. The apparatus of claim 16, wherein the micro-bump has a diameter of less than or equal to approximately ten micrometers, and wherein a micro-bump pitch corresponding to the micro-bump is less than or equal to approximately twenty micrometers.

18. The apparatus of claim 13, wherein each of the respective bi-directional buffer circuits is configured to apply a third voltage value to each TSV of a second group of TSVs that are adjacent to the first group of TSVs prior to detecting the second voltage value, wherein the TSV short condition is determined in response to the second voltage value and the third voltage value having a same logical value.

19. The apparatus of claim 13, wherein each of the respective bi-directional buffer circuits is configured to apply a third voltage value to a TSV of the first group of TSVs prior to detecting the second voltage value at another TSV of the first group of TSVs, wherein the TSV open condition is determined in response to the second voltage value and the third voltage value having different logical values.

20. The apparatus of claim 13, wherein each of the respective bi-directional buffer circuits is configurable to be coupled together to form one or more scan chains to enable providing a logical high, a logical low, or a high-impedance output value to each particular TSV and to enable reading a logical voltage value from each particular TSV.

21. The apparatus of claim 20, wherein the TSV test circuit is further configured to:
perform a TSV short testing operation that includes:
populating the bi-directional buffer circuits with a first set of logical values via the one or more scan chains to enable the first group of TSVs to have the high-impedance output value and to enable a second group of TSVs adjacent to the first group of TSVs to have the logical high output value; and
reading, via the one or more scan chains, a logical value of each input buffer cell corresponding to the first group of TSVs to determine whether any TSV of the first group of TSVs corresponds to the TSV short condition;
perform a TSV open testing operation that includes:
populating the bi-directional buffer circuits with a second set of logical values via the one or more scan chains to enable a particular TSV of the first group of TSVs to have the logical high output value and to enable other TSVs of the first group of TSVs to have the high impedance output value; and
reading, via the one or more scan chains, a logical value of each input buffer cell corresponding to the other TSVs of the first group of TSVs to determine whether any of the other TSVs of the first group of TSVs corresponds to the TSV open condition; and
after at least one of the semiconductor device and the multi-contact probe is moved to couple the multi-contact probe to another group of the TSV contacts, applying the TSV short testing operation and the TSV open testing operation to test the other group of TSV contacts.

22. The apparatus of claim 13, further comprising a device selected from a group consisting of a set top box, a music player, a video player, an entertainment unit, a navigation device, a communications device, a personal digital assistant (PDA), a fixed location data unit, and a computer, into which the semiconductor device is integrated.

23. The apparatus of claim 13, wherein each of the bi-directional buffer circuits includes an output enable cell, an output buffer cell, and an input buffer cell.

24. An apparatus comprising:
a semiconductor device including:
means for providing a conductive path between a multi-contact probe and one or more through-silicon vias (TSVs), wherein each of the one or more TSVs is coupled to a respective bi-directional buffer circuit;
means for selectively biasing the one or more TSVs to a programmable voltage and for reading a voltage at the one or more TSVs; and
means for determining, after a first group of TSV contacts of one or more TSV contacts is contacted with the multi-contact probe and a first voltage value is applied to each of the first group of TSV contacts via the multi-contact probe, wherein the first group of TSV contacts corresponds to a first group of TSVs of the one or more TSVs, based on a second voltage value detected at a particular TSV of the first group of TSVs, whether the particular TSV corresponds to a TSV open condition or a TSV short condition.

25. The apparatus of claim 24, further comprising a device selected from a group consisting of a set top box, a music player, a video player, an entertainment unit, a navigation device, a communications device, a personal digital assistant (PDA), a fixed location data unit, and a computer, into which the semiconductor device is integrated.

26. A non-transitory computer readable tangible medium storing instructions executable by a computer, the instructions comprising:
instructions that are executable by the computer to contact a first group of through-silicon via (TSV) contacts with a multi-contact probe and to apply a first voltage value to each of the first group of TSV contacts via the multi-contact probe, wherein the first group of TSV contacts corresponds to a first group of TSVs, and wherein each TSV of the first group of TSVs is coupled to a respective bi-directional buffer circuit; and
instructions that are executable by the computer to determine, based on a second voltage value detected at a particular TSV of the first group of TSVs, whether the particular TSV corresponds to a TSV open condition or a TSV short condition.

27. A method comprising:
a step for contacting a first group of through-silicon via (TSV) contacts with a multi-contact probe and a step for applying a first voltage value to each of the first group of TSV contacts via the multi-contact probe, wherein the first group of TSV contacts corresponds to a first group of TSVs, and wherein each TSV of the first group of TSVs is coupled to a respective bi-directional buffer circuit; and
a step for determining, based on a second voltage value detected at a particular TSV of the first group of TSVs, whether the particular TSV corresponds to a TSV open condition or a TSV short condition.

28. The method of claim 27, wherein the step for determining is performed at a processor integrated into an electronic device.

29. A method comprising:
receiving design information comprising physical positioning information of a packaged semiconductor device on a circuit board, the packaged semiconductor device comprising:
one or more through-silicon via (TSV) contacts coupled to one or more TSVs, wherein each TSV is coupled to a respective bi-directional buffer circuit including an output enable cell, an output buffer cell, and an input buffer cell; and
a TSV test circuit configured, after a first group of TSV contacts of the one or more TSV contacts is contacted with a multi-contact probe and a first voltage value is applied to each of the first group of TSV contacts via the multi-contact probe, wherein the first group of TSV contacts corresponds to a first group of TSVs of the one or more TSVs, to determine, based on a second voltage value detected at a particular TSV of the first group of TSVs via the respective bi-directional buffer circuit, whether the particular TSV corresponds to a TSV open condition or a TSV short condition; and transforming the design information to generate a data file.

30. The method of claim 29, wherein the data file has a GERBER format.

31. The method of claim 29, wherein the data file has a GDSII format.

\* \* \* \* \*